United States Patent [19]

Endo et al.

[11] 4,446,399

[45] May 1, 1984

[54] STRUCTURE OF THIN ELECTROLUMINESCENT DISPLAY PANEL SEALED BY GLASS SUBSTRATES

[75] Inventors: Yoshihiro Endo; Masashi Kawaguchi; Etsuo Mizukami; Hiroshi Kishishita, all of Nara, Japan

[73] Assignee: Sharp Kabushiki Kaisha, Osaka, Japan

[21] Appl. No.: 270,882

[22] Filed: Jun. 5, 1981

[30] Foreign Application Priority Data

Jun. 13, 1980 [JP] Japan ................................ 55-80346

[51] Int. Cl.³ ...................... H05B 33/04; H05B 33/06
[52] U.S. Cl. .................................. 313/505; 313/509; 313/512
[58] Field of Search ........................ 313/509, 512, 505

[56] References Cited

U.S. PATENT DOCUMENTS 3,435,270  3/1969  Vodicka ............................ 313/509
4,213,074  7/1980  Kawaguchi et al. ........... 313/512 X
4,287,449  9/1981  Takeda et al. ...................... 313/509

FOREIGN PATENT DOCUMENTS 169689  3/1965  U.S.S.R. ............................. 313/512

Primary Examiner—Palmer C. Demeo
Attorney, Agent, or Firm—Birch, Stewart, Kolasch and Birch

[57] ABSTRACT

A thin electroluminescent (EL) display panel comprises an EL thin film unit for generating an EL light, a pair of glass substrates for sealing the EL thin film unit, a protective liquid within the cavity defined by the glass substrate for protecting the EL thin film unit, a pair of electrodes for conducting electric energy to the EL thin film unit, and a terminal connected to at least one of the pair of electrodes, the terminal comprising a metal such as Al, Al-Ni, Ag-Mn, etc., and the terminal being coupled to a power source.

8 Claims, 1 Drawing Figure

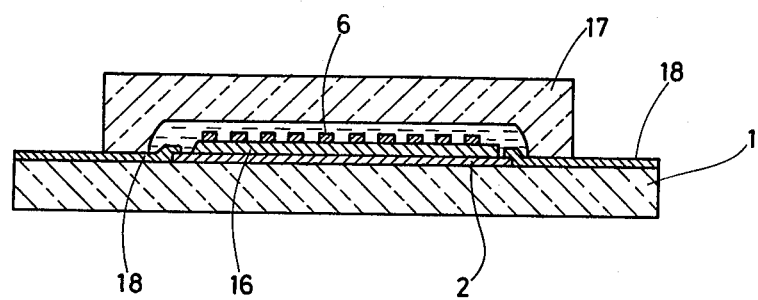

STRUCTURE OF THIN ELECTROLUMINESCENT DISPLAY PANEL SEALED BY GLASS SUBSTRATES

BACKGROUND OF THE INVENTION

The present invention relates to an thin-film electroluminescent display panel and, more particularly, to a thin-film electroluminescent display panel shielded by a pair of glass substrates and a protective liquid disposed therebetween.

A conventional thin electroluminescent (EL) display panel sealed by a pair of glass substrates and a protective liquid is disclosed in Kawaguchi et al, U.S. Pat. No. 4,213,074 issued July 15, 1980, assigned to the common assignee and entitled "THIN-FILM ELECTROLUMINESCENT DISPLAY PANEL SEALED BY GLASS SUBSTRATES AND THE FABRICATION METHOD THEREOF". The disclosure of this patent is incorporated herein by reference.

In the structure of the thin EL display panel, it is very important and necessary to prevent any moisture from penetrating into the housing of the display panel defined by the pair of glass substrates. The presence of the moisture mainly lowers the intensity of the EL light from the EL display panel.

In this respect, the above patented structure of the EL display panel inherently had the disadvantages that since a transparent electrode under an EL thin film is conventionally made of $In_2O_3$ or $SnO_2$ etc. which is rather porous because of high crystallization, some moisture from the atmosphere can easily penetrate and diffuse into the housing of the EL display panel through the transparent electrode. The transparent electrode extends from the inner side of the housing to the outer side through the bonded connection between the pair of glass substrates.

Therefore, it is highly desired to completely shut out any moisture from penetration into the interior of the housing.

SUMMARY OF THE INVENTION

Accordingly, it is an object of the present invention to provide an improved structure adapted for a thin EL display panel sealed by a pair of glass substrates.

It is another object of the present invention to provide an improved lead connection for connecting a thin EL display element to an external power supply source, the thin EL display element being disposed within a housing defined by a pair of glass substrates.

Briefly described, in accordance with the present invention, a thin electroluminescent (EL) display panel comprises an EL thin film unit for generating an EL light, a pair of glass substrates for sealing the EL thin film unit, a protective liquid filled within a cavity defined by the glass substrates for protecting the EL thin film unit, a pair of electrodes for conducting electric energy to the EL thin film unit, and a terminal connected to at least one of the pair of electrodes, the terminal comprising a metal such as Al, Al-Ni, Au-Mn, or the like and the terminal being coupled to a power source.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

the single FIGURE shows a cross-sectional view of a thin EL display panel according to the present invention.

DESCRIPTION OF THE INVENTION

The principle used in accordance with the present invention lies in the fact that a film made of any metal can prevent penetration of any moisture therethrough because of the minuteness of the metal substance.

With reference to the drawings, the thin EL display panel of the present invention comprises a transparent flat glass substrate 1, a plurality of transparent electrodes 2, a plurality of counter electrodes 6, an EL unit 16, a plate-shaped glass substrate 17, and lead terminals 18.

The transparent electrodes 2 are made of $In_2O_3$, $SnO_2$, or the like. The counter electrodes 6 are made of a metal such as Al, and the like.

The transparent electrodes 2 are arranged on the glass substrate 1 in parallel with each other. The counter electrodes 6 are arranged so that they cross at a right angle relative to the transparent electrodes 2 in a plane view. The cross point betweeen the transparent electrodes 2 and the counter electrodes 6 produces the element for the EL panel. AC energy from a power source (not shown) is applied to the transparent electrodes 2 and the counter electrodes 6.

The EL unit 16 comprises an EL thin film interposed between first and second dielectric layers. The first dielectric layer comprises $Y_2O_3$, $TiO_2$, $Al_2O_3$, $Si_3N_4$ and $SiO_2$, and the like. which is disposed by a sputtering technique or by electron beam evaporation. The EL thin film is made of a ZnS thin film doped with manganese in a desired amount. The second dielectric layer comprises a similar material as that of the first dielectric layer.

The EL panel has a sealing structure for the EL unit, namely, the first and the second dielectric layers and the EL thin film. The substrate 17 is provided for sealing the EL unit together with the transparent glass substrate 1. The substrate 17 is not required to be transparent because viewing is made from the substrate 1.

The plate-shaped glass substrate 17 is tightly bonded by an adhesive of, for example, a photo curing resin, to the transparent glass substrate 1. The plate-shaped glass substrate 17 is made of a soda glass having a thickness of 3 mm. A dent 1 mm deep is formed within the plate-shaped glass substrate 17 for locating the EL unit through the use of an etching technique.

A protective liquid is contained within a cavity defined by the two substrates 1 and 17. The protective liquid functions to preserve the EL unit. The protective liquid can be silicon oil or grease which are suitable for vacuum sealing.

It is preferable that the protective liquid have the following properties:
(1) capable of penetrating into pin holes appearing in the first and the second dielectric layers;
(2) resistant to a high voltage;
(3) resistant to considerable heat and humidity;
(4) inert with the material of the EL unit; and
(5) has a small vapor pressure and a small coefficient of thermal expassion.

The items (1), (2) and (4) are very important factors for the protective liquid.

As a feature of the present invention, the transparent electrodes 2 do not extend out of the cavity defined by the two substrates 1 and 17. They are completely within the cavity although they are larger than the length of the EL unit 16 so that edges of the transparent electrodes 2 project beyond the edges of the EL unit 16. Each of the lead terminals 18 is connected to the transparent electrode 2 at the projected edge. The lead terminals 18 are made of a metal such as Al, Al-Ni, Ag-Mn, and the like. The lead terminals 18 extend out of the cavity through the connection between the substrates 1 and 17.

Since the counterelectrodes 6 are made of a metal, they directly extend out of the cavity through the connection between the substrates 1 and 17. The lead electrodes 18 are prepared by mask evaporation, etching or the like. They are disposed on the edges of the transparent electrodes 2 and on the glass substrate 1. A control circuit (not shown) is coupled to the lead terminals 18 to apply the AC power energy to the EL unit 16.

In accordance with the present invention, all of the electrodes or terminals 18 positioned at the connection between the glass substrates 1 and 17 are made of a metal so as to completely prevent penetration of any moisture into the electrodes 6 or terminals 18 and further into the cavity of the thin EL display panel.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A thin-film electroluminescent display panel comprising:

first and second substrates bonded together and sealed so as to define a cavity therebetween, a composite comprising a thin-film electroluminescent layer interpositioned between a pair of dielectric layers, said composite being disposed within said cavity, at least one of said first and second substrates being transparent to light emitted by said electroluminescent layer when said layer is properly stimulated;

at least one pair of opposing electrodes positioned so as to sandwich said composite therebetween, each of said pair of opposing electrodes comprising a first transparent porous electrode material, adjacent said at least one transparent substrate, contained completely within said cavity so as not to extend into or beyond said seal between said first and second substrates thereby preventing moisture from penetrating into said cavity, and a second metallic counterelectrode;

a protective liquid provided within said cavity defined by said substrates and being in contact with said dielectric layers, and terminal means connected within said cavity to said respective transparent electrodes for providing a lead connection for said electroluminescent layer to a power source means outside said cavity, said terminal means comprising a metal and said respective transparent electrodes being longer than the length of said electroluminescent layer.

2. The display panel of claim 1, wherein said terminal means penetrates a seal which joins said first and second substrates.

3. The display panel of claim 1, wherein said terminal means comprises Al, Al-Ni, Ag-Mn, and the like.

4. The display panel of claim 1, wherein said transparent porous electrode material comprises a plurality of transparent electrodes made of $In_2O_3$, $SnO_2$, and the like connected to said terminal means, within said cavity.

5. The display panel of claim 1, wherein said metallic counter electrode comprises a plurality of electrodes which extend outside of said cavity.

6. The display panel of claim 1, wherein said protective liquid is silicon oil.

7. The display panel of claim 1, wherein said protective liquid is grease.

8. The display panel of claim 1, wherein said substrates comprise first and second glass substrates.

* * * * *